United States Patent [19]

Marshall

[11] 4,125,820

[45] Nov. 14, 1978

[54] STRESS SENSOR APPARATUS

[75] Inventor: James F. Marshall, St. Paul, Minn.

[73] Assignee: Honeywell Inc., Minneapolis, Minn.

[21] Appl. No.: 724,827

[22] Filed: Sep. 20, 1976

Related U.S. Application Data

[63] Continuation-in-part of Ser. No. 619,866, Oct. 6, 1975, abandoned.

[51] Int. Cl.² ............................................. G01L 1/22
[52] U.S. Cl. .................................... 338/4; 73/777; 357/26
[58] Field of Search ............................. 338/2–5, 338/42; 73/88.5 SD, 398 AR; 357/26; 29/610 SG, 580

[56] References Cited

U.S. PATENT DOCUMENTS

| 3,417,361 | 12/1968 | Heller | 338/4 X |
| 3,513,430 | 5/1970 | Heller | 338/4 |
| 3,739,315 | 6/1973 | Kurtz et al. | 338/3 |
| 3,838,379 | 9/1974 | Gieles et al. | 338/4 X |
| 3,873,956 | 3/1975 | Kurtz et al. | 338/4 X |

*Primary Examiner*—C. L. Albritton
*Attorney, Agent, or Firm*—Theodore F. Neils

[57] ABSTRACT

Semiconductor material stress sensors are provided where the sensing resistors therein have good electrical stability while being sufficiently protected without degrading sensor performance. This is accomplished through control of the locations of the maximum concentrations of the resistor dopant. The mounting of semiconductor stress sensors on mounts of a different material type in a manner minimizing offset temperature shifts is disclosed.

44 Claims, 27 Drawing Figures

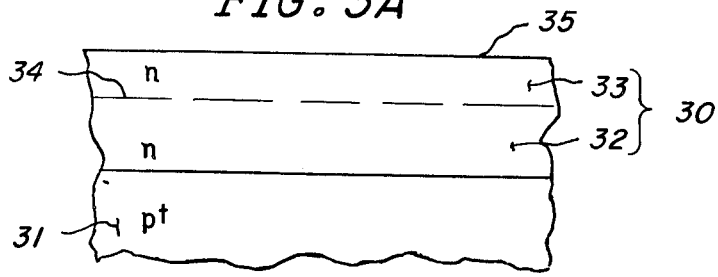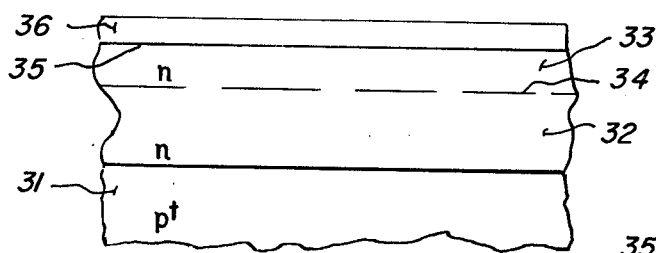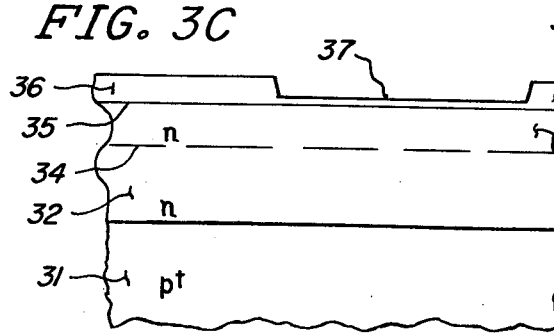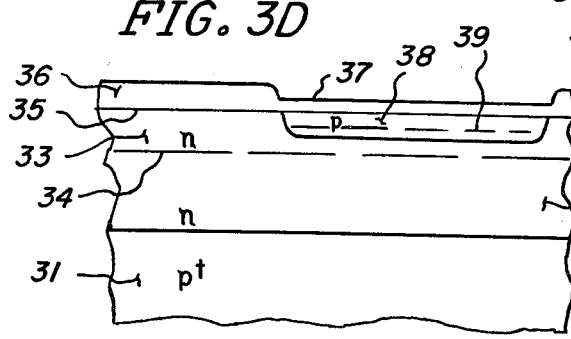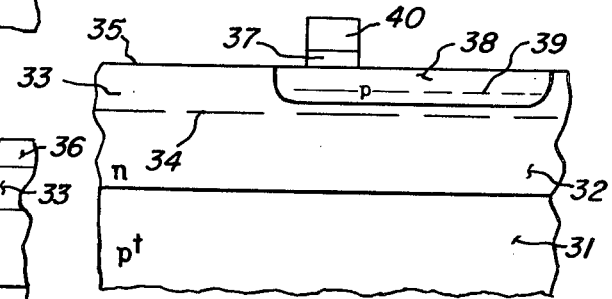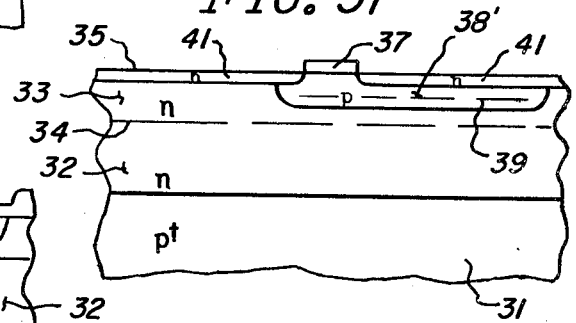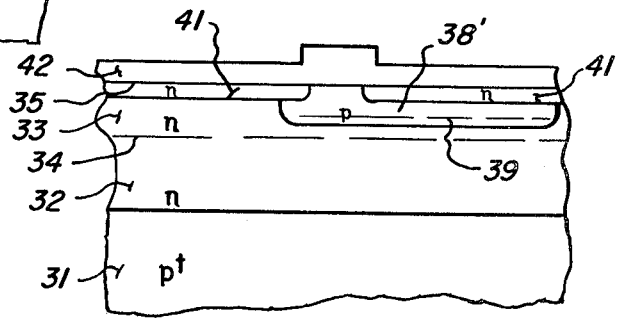

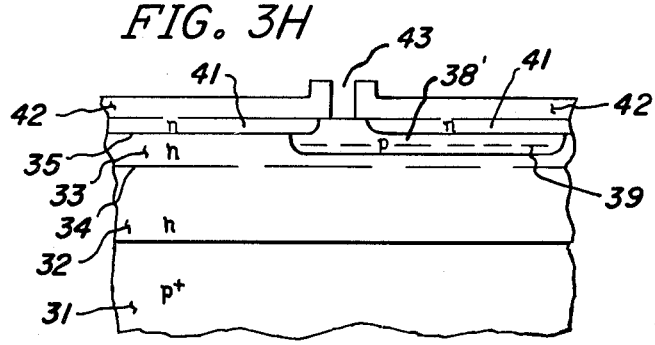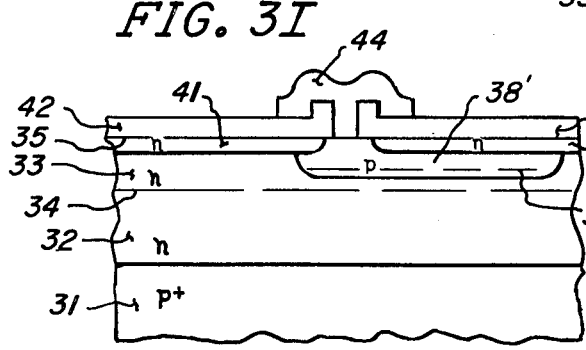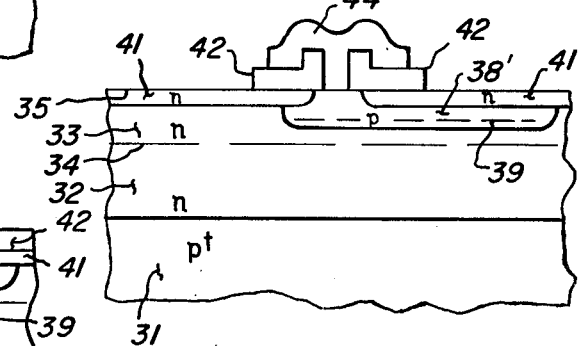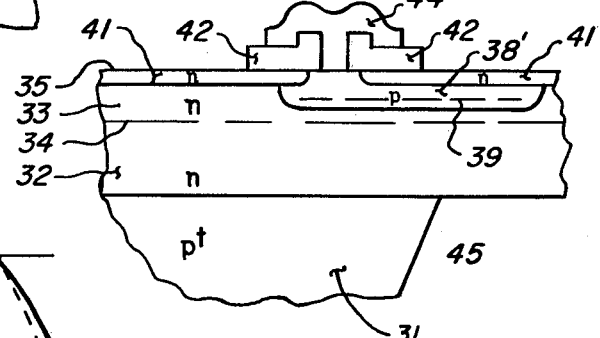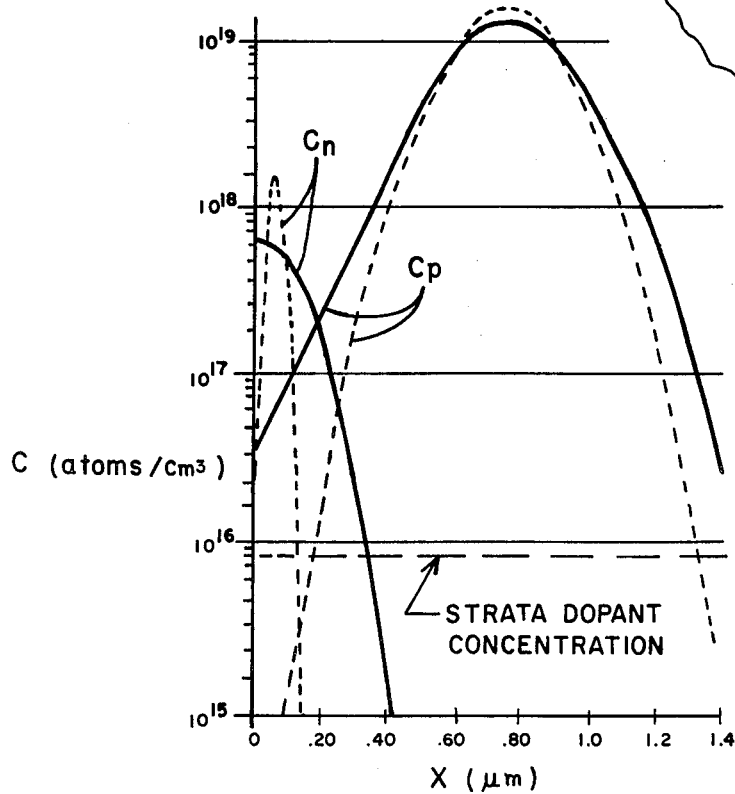

STRESS SENSOR APPARATUS

REFERENCE TO RELATED APPLICATIONS

This application is a continuation-in-part of a copending patent application Ser. No. 619,866 filed Oct. 6, 1975, and now abandoned, by James F. Marshall entitled STRESS SENSOR APPARATUS, which is assigned to the same assignee as the present invention.

BACKGROUND OF THE INVENTION

The invention herein relates to stress sensors and, in particular, to semiconductor material stress sensors based on the piezoresistive effect.

The use of the piezoresistive effect in silicon as the transduction basis for a stress sensor is well known and such stress sensors are widely used. Typically, a p-type conductivity region is formed in an n-type conductivity silicon layer by diffusion so that the p-type region serves as pn junction isolated resistor. Usually, this resistor is provided in a diaphragm structure over which the stress to be measured is exerted. By electrically contacting the p-type region or resistor at two points and measuring the resistance change between these contacts during applications of stress due to the piezoresistive effect, the magnitude of the applied stress can be determined.

To protect such surface diffused p-type conductivity regions serving as resistors for sensing stress through the piezoresistive effect, i.e. piezoresistors, from contaminants, etc., they and the immediate surroundings must be covered by some protective material. Usually, a silicon dioxide layer is provided on the surface of the silicon to cover at least the junction area between the piezoresistor and its surroundings and, most often, the entire silicon surface.

The silicon dioxide-silicon interface occurs, of course, at the silicon surface diffused from which is approximately where the dopant concentration of the p-type conductivity diffused region, or piezoresistor, is a maximum, a characteristic of the surface diffusion process. Silicon dioxide will, during its formation, take up some kinds of p-type diffusants, or dopants, and therefore, the maximum dopant concentration occurring at the silicon surface can be substantially altered from the initially predeposited maximum concentration. This will reduce the maximum dopant concentration in the silicon as well as the total amount of dopant in the silicon after diffusion. The maximum dopant concentration value has been found to be strongly related to the stress sensor transduction performance over temperature, that performance being the resistance change versus applied stress as a function of temperature over a range of temperatures, that is, the piezoresistive temperature coefficient. The total resistance value of the piezoresistor at any given temperature is, of course, related to the total amount of dopant provided in the p-type conductivity region.

Thus, both the resistance value of the piezoresistor at a particular temperature and the resistance values of the piezoresistor versus stress over a temperature range are subject to substantial changes because of the formation of a protective silicon dioxide layer. Because the effects of forming such a silicon dioxide layer vary substantially from sensor unit to sensor unit, particularly when the sensor units are from distinct process runs, the piezoresistors resulting differ from the piezoresistor intended in an unpredictable manner, i.e. the resulting piezoresistors are nonuniform or, in other words, have characteristics differing considerably from sensor unit to sensor unit. This variability or nonuniformity presents difficult problems in providing compensation schemes to produce a stress sensing system output signal which will accurately reflect the external stress exerted upon the stress sensor.

Piezoresistor nonuniformity is not the only cause of inaccurate stress sensor performance in the above-described stress sensor construction. The silicon dioxide itself and any metallic interconnection leads to or across the piezoresistor or any other materials occurring over the diaphragm will alter the diaphragm thermal and mechanical response to changing temperatures and to applied stress from that which it would be without these constraints present on the diaphragm surface. This alteration of diaphragm responses, leading to further errors in determining the external stresses exerted on the diaphragm, occur because of the internally generated, temperature dependent stresses and the thermal and mechanical hysteresis at the interfaces of the diaphragm and its covering materials. The extent of these effects will vary considerably from stress sensor unit to stress sensor unit.

Internally generated stresses occur because of mismatches in the thermal expansion characteristics of two or more materials present in the diaphragm. Hysteresis occurs when two or more of the materials slip with respect to one another as the result of stress or temperature change.

A typical situation in which these internally generated stresses detrimentally occur is that in which the use is made of a silicon nitride layer over the silicon dioxide or use is made of an organic material over the silicon dioxide to prevent contamination of the silicon dioxide by ions. The use of an organic material will typically also lead to difficult hysteresis problems.

Any attempt to cure hysteresis problems in a relatively low cost sensing system can only make economic sense by being directed toward minimizing the problem rather than being directed to compensating the hysteresis effects. This is because compensation requires a memory system to remember the history of the hysteresis source over the last cycle of the hysteresis loop. The problem is compounded by the variability in hysteresis loops from sensor to sensor. Thus, adding significantly to hysteresis problem is to be strongly avoided. Increasing the variability temperature coefficient because of temperature dependent, internally generated stresses is also clearly undesirable because of the difficulties introduced in providing a temperature compensation scheme.

However, use of such additional covering materials to prevent ion contamination of the silicon dioxide covering layer is often attempted because of substantial changes which can occur in piezoresistor characteristics over time resulting from such ion contamination. Due to (i) mobile ions which are contaminants in the silicon dioxide and which can reach the silicon dioxide-silicon interface, and (ii) fixed ionic charges also contaminating the silicon dioxide which are able to induce charges at that silicon dioxide-silicon interface, the diffused resistors which are to be protected are also rendered electrically unstable over time to a greater or lesser degree by the silicon dioxide layer provided.

This time instability results because the charges appearing at the silicon dioxide-silicon interface convert portions of the silicon layer to a p-type conductivity even though these portions of the silicon layer were in the initially intended n-type conductivity silicon regions and outside the initially intended p-type conductivity region. These additions to the intended p-type region enlarge that region, and so reduce the resistance value intended for the diffused p-type region, and, further, these additions add area to the pn junction, i.e. semiconductor junction, which occurs between adjacent regions of opposite conductivity types. The added p-type region portions tend to reduce the resistance initially intended to occur in the p-type region by enlargement thereof, as already mentioned, and to also reduce intended resistance by the increasing of the semiconductor junction area. The increased junction area leads to increases in the junction leakage current which has the effect of reducing the intended resistance.

The charge occurring at the silicon dioxide-silicon interface in the above-described sensor construction is a source of electrical instability over time because the charge changes in both amount and location thereby altering the p-type conductivity region, or piezoresistor formed, in the silicon layer. These interface charges are highly variable in amount present initially and over time in depending strongly on operating environment in use and on the details of the processing in any given sensor fabrication sequence. The mobile charges are also vary in location in the silicon dioxide, and so in effect over time, depending on the voltages and temperatures experienced in use.

Signals indicating applied external stress provided by the piezoresistors in semiconductor material stress sensors are almost always supplied to signal processing circuitry for modification. At the very least, stress sensor output in response to applied stress will always shift with temperature for a silicon piezoresistor, i.e. there is a temperature coefficient associated with every piezoresistor, as in indicated in FIG. 1. There, resistance change, $\Delta R$, versus stress, S, is plotted for three different absolute temperatures, $T_1$ to $T_3$, and for two different maximum dopant concentrations, $MC_1$ and $MC_2$. The total number of acceptor atoms, $N_D$, is held constant.

This temperature performance of the piezoresistors must always be compensated by signal processing circuitry if the sensing system is to provide an accurate indication of the external stress applied thereto. If the characteristics shown in FIG. 1 are (i) uniform from unit to unit, (ii) constant over time, and (iii) independent of the history of applied heat and stress, then signal processing circuitry can be designed to just cancel out the temperature dependence of the piezoresistors so that output signals from the signal processing are always an accurate indication of the stress exerted on the stress sensor.

However, as discussed in the preceding, the addition of a silicon dioxide layer over the silicon surface containing surface diffused piezoresistors leads to nonuniform piezoresistors, to degraded thermal and mechanical responses of piezoresistors and to instability over time of the piezoresistor characteristics. In many instances, it is entirely impractical to attempt to compensate for hysteresis at all. If the temperature performance is not the same from sensor unit to sensor unit because of nonuniformities in the piezoresistor construction, then the compensation scheme must be adjusted for each unit. Similar provisions must be made for nonuniform resistance values of the piezoresistors from unit to unit. Such adjustments are a time consuming and expensive operation. And, if the temperature performance and resistance values change over time in use, the compensation scheme must also be adjusted over time, an often prohibitive requirement for many potential uses.

SUMMARY OF THE INVENTION

A semiconductor material stress sensor is provided wherein a semiconductor material layer is of a first conductivity type except in selected regions thereof including a first selected region provided for sensing applied stress with this first selected region being of a second conductivity type. The layer is partly in a diaphragm portion of the sensor and to some degree in a constraint portion of the sensor. The first region is at least partly in the diaphragm and has its second conductivity type due to a first dopant therein which first dopant has a region of maximum concentration in the diaphragm portion of the first region that is spaced apart from the layer surfaces. The first region may also be in the constraint portion of the layer. A second region of having the first conductivity type may be provided in the space between the region of maximum first dopant concentration and the layer surface portion from which it is spaced apart in the diaphragm.

The semiconductor layer may be in an epitaxial layer provided on a semiconductor substrate, the substrate having a recess therein to provide the diaphragm and constraint structure. A material with a closely matched thermal coefficient of expansion such as silicon or low thermal expension glass may also be bonded to the substrate to provide support or a means of communication with the stress sensor or to enclose a fixed reference pressure against one side of the diaphragm.

Such a semiconductor material stress sensor can be provided by implanting the first region into the semiconductor layer followed by providing the second region in the semiconductor layer such that the second region does not reach the region of maximum first dopant concentration in the first region. This providing of the second region may be conveniently done by ion implantation. By having the second region located such as to allow a portion of the first region to intersect a semiconductor layer surface in the constraint, electrical contact may be conveniently made to the first region.

Providing the semiconductor layer itself as an epitaxial layer on a semiconductor substrate allows the substrate to be etched to provide both the diaphragm and the constraint. The epitaxial layer can be advantageously provided in a first strata of relatively high resistivity followed by a second strata of lower resistivity.

BRIEF DESCRIPTION OF THE DRAWINGS

FIGS. 3a-3k show the results of a series of process steps used to construct the semiconductor material stress sensor shown in FIGS. 2a and 2b, FIG. 4 shows a dopant atom profile for a semiconductor material stress sensor constructed by the process associated with FIGS. 3a-3k.

DESCRIPTION OF THE PREFERRED EMBODIMENTS

Figure 1:
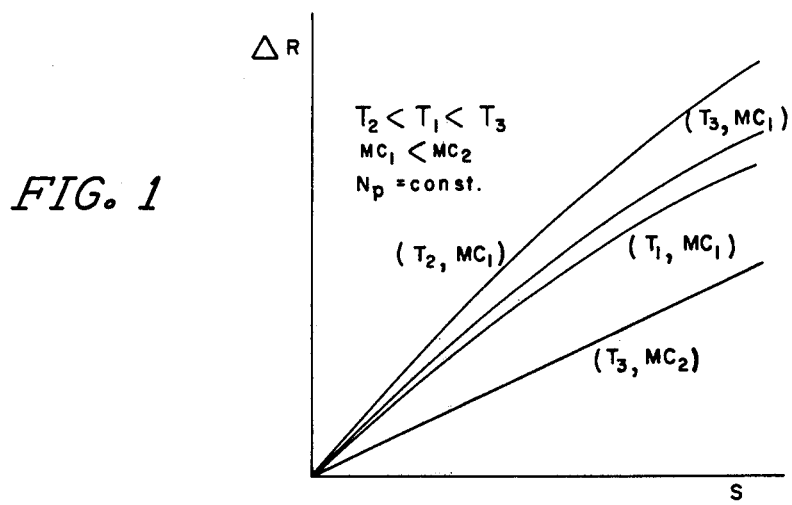
FIG. 1 shows a plot of the performance characteristic of a piezoresistor formed in a silicon layer by a dopant.

The piezoresistive temperature coefficient of a junction isolated piezoresistor in silicon has been found to be strongly related to the maximum dopant concentration of the dopant used to form the piezoresistor in the silicon. The resistance value of the piezoresistor, on the other hand, is strongly related to the total number of dopant atoms which are present in the junction isolated piezoresistor. This allows some independent control of the values of the piezoresistive temperature coefficient and of the total resistance by independently varying the maximum concentration of and the total number of dopant atoms. The piezoresistive temperature coefficient relationship to the maximum dopant concentration is reflected in FIG. 1 by the differently sloped curves for different maximum dopant concentrations at the same temperature.

As discussed above, if the maximum dopant concentration occurs at a silicon dioxide-silicon interface, then the intended maximum dopant concentration and intended total number of dopant atoms present can both be strongly affected by the interface conditions. The interface conditions are very process dependent and will not be uniform from stress sensor unit to stress sensor unit and, further, the interface conditions in such a stress sensor unit will change over time. As previously indicated, this leads to the necessity of making adjustments in the signal processing circuitry receiving the stress sensor output signals if accurate compensation over temperature and over time is to be maintained.

Thus, removal of the piezoresistor or of its region of maximum concentration from the immediate vicinity of a silicon dioxide-silicon interface is quite desirable in the structural design for a stress sensor. Of course, the piezoresistor must still be rather close to a silicon surface in a diaphragm to experience a substantial strain in response to an external stress exerted on the diaphragm. A relatively small separation with respect to a silicon dioxide-silicon interface is all that is required to avoid much of the previously set out difficulty.

A first possibility is to diffuse a region of a conductivity type opposite that of the piezoresistor region conductivity type right over much of the piezoresistor region to achieve a separation between the piezoresistor and the interface, i.e. a pinch resistor situation. The diffusion would be directed over the sensing portions of the piezoresistor at least if not also over any resistive leadout portions present. This possibility has serious difficulties, however, because any surface diffusion always results in having a maximum diffusant or dopant concentration occur at the surface through which the diffusion occurs. That is, both the piezoresistor diffusion and the subsequent covering diffusion thereover will have a peak concentration approximately at the surface of the semiconductor layer through which the diffusions occur.

Diffusion control in production, however, is not such that the second diffusion could be well controlled in depth with respect to the surface diffused from and so not well controlled in depth with respect to the dopant profile of the dopant used in the first diffusion for forming the piezoresistor region. Since the piezoresistor region dopant has a peak concentration at the surface diffused from and has a profile changing sharply with depth below this surface, small changes in the depth of the second diffusion intended to cover the piezoresistor region results in substantial differences in both the total number of piezoresistor dopant atoms and in the resulting maximum concentration of these atoms. The inevitability of such changes due to insufficient depth control again means an undesirable, but substantial, variability in electrical characteristics from sensor unit to sensor unit. This situation is reflected in the wellknown variability in resistance values of pinch resistors from one process run to another and even between widely separated pinch resistors on the same chip.

A conventional pinch resistor is also quite voltage dependent because of the processing just described since the region in the silicon serving as a resistor has a relatively low dopant concentration. This low concentration occurs because the high dopant concentration location in the first diffusion is effectively cancelled out by the second diffusion. The low dopant concentration in the pinch resistor region of the silicon allows substantial depletion regions, which are quite voltage dependent, to develop in the pinch resistor region which effectively increases the resistance value of the pinch resistor.

To attempt to avoid the problems arising in a process having a second diffusion over a piezoresistor diffusion, as just described, the piezoresistor might be diffused into the silicon layer followed by growing an epitaxial layer thereover. This provides for separation of the piezoresistor from the silicon structure surface in much the same way a buried layer is formed in the construction of a bipolar transistor. Again, however, because the maximum dopant concentration of the diffused piezoresistor occurs at the surface diffused from, difficulties arise.

To grow an epitaxial layer, one of the first steps usually required is to etch the silicon layer surface to promote good crystalline growth thereon. This etching would have a substantial and variable effect on a diffused piezoresistor maximum dopant concentration, occurring at the surface to be grown upon, because of inability to accurately control the depth of the etch. This variable etching depth leads to unrepeatable maximum dopant concentrations in the resulting piezoresistors from one stress sensor unit to another and, in addition, strongly affects the total resistance of these piezoresistors because the total number of dopant atoms remaining present would vary with the depth of the etch. This is quit analogous to being unable to control the depth of the diffusion in the above-described double diffusion process. Further, in an epitaxial growth process, there is always some out-diffusion from the silicon layer into the grown epitaxial layer during its growth.

Thus, the providing a doped region for a piezoresistor is a silicon layer having its maximum dopant concentration well below the layer surface is necessary to obtain uniform stress sensor performance, both as to the piezoresistive temperature coefficient value and as to the total resistance value. This is also required to further sensor stability over the life of the unit. Such a step allows providing uniform and stable semiconductor junction isolated resistors in silicon or uniform and stable piezoresistors in a stress sensor silicon diaphragm.

Ion implantation of the piezoresistor dopant provides very good and very repeatable results for both the depth, or location, of the region of maximum dopant concentration in the piezoresistor doped region and the total number of dopant atoms provided in the doped piezoresistor region. This is true because ion implantation permits precisely controlled placement of the maximum dopant concentration at a selected depth below the silicon layer surface with ordinary ion implantation production equipment in production conditions, within reasonable limits, of course. And, ion implantation of the piezoresistor dopant allows considerable freedom in setting both the maximum dopant concentration and the total number of dopant atoms provided relatively independently of one another. The result is that the temperature coefficient and the total resistance of the piezoresistor, i.e. the doped piezoresistor region sheet resistance, can be determined relatively independently of one another.

Once the need is met for placing the maximum dopant concentration region of the piezoresistor sufficiently far into the silicon layer to avoid later processing step problems, there are two possibilities in further constructing the stress sensor. The silicon layer can be either (i) covered or altered near the surface to further protect the piezoresistor, or (ii) any further silicon layer surface treatment can be omitted. The latter instance is possible, if there are no sources of significant contamination in use or if the silicon surface can be protected in use from contamination. The benefit here is that any oxidation steps required in providing electrical contacts can be performed without taking up significantly any of the piezoresistor region dopant.

However, stress sensor units will be exposed to contamination during use in many applications. Then surface treatment of the silicon layer is required to protect the piezoresistors. Some of the piezoresistor protection methods described above, which were prone to problems when used with diffused piezoresistors, can be used with considerably fewer problems now that the region of maximum dopant concentration of the piezoresistor is located well below the silicon layer surface.

For instance for some applications, a protective silicon dioxide layer can now be provided on the surface to protect the piezoresistor which will lead to silicon dioxide-silicon interface problems less severe than those described above. This is because the providing of the silicon dioxide layer will have relatively little effect upon the maximum dopant concentration in the piezoresistor which is spaced apart from the interface substantially and so upon the total number of dopant atoms is the piezoresistor. However, the oxide on the silicon layer would still alter the mechanical response of the silicon layer to stress exerted thereon relative to the response with no oxide layer present thus limiting stress sensor accuracy. Also, the silicon dioxide silicon interface conditions still affect to some extent the total number of dopant atoms and so limit the accuracy of the piezoresistor to some extent.

Other protection possibilities, for a region of maximum dopant concentration located sufficiently deep in the piezoresistor, would include (i) the diffusion of a region of an opposite conductivity type to that of the piezoresistor region over and into the piezoresistor region, or (ii) the growth of an epitaxial layer of this opposite conductivity type over the piezoresistor region. The uncertainties of depth in diffusing a covering region or of depth in etching for epitaxial growth or the uncertainties of out diffusion during epitaxial growth will cause much less variations in the temperature coefficient or in the total resistance value of a piezoresistor having a sufficiently deep region of maximum dopant concentration, i.e. a maximum dopant concentration region spaced apart from the semiconductor junction formed by the diffused region or the epitaxial layer and the piezoresistor region.

Nevertheless, the lack of control of the diffusion or epitaxial growth process steps will quite often cause some interaction with the piezoresistor region approaching the region of maximum dopant concentration therein and so will limit the uniformity to some extent of semiconductor stress sensor units. The extent of such limiting will become progressively greater as the region of maximum dopant concentration in the piezoresistor is closer to the regions substantially affected by either a diffusion or an epitaxial growth process.

The difficulty in getting the region of maximum concentration the piezoresistor deep enough into the silicon layer, and thereafter protecting it by one of the foregoing protective measures, will, as stated, affect the uniformity and stability of the piezoresistors to some degree. This degree will be significant enough to make stress sensor units resulting from these operations unsatisfactory for some stress sensor applications requiring a substantial degree of accuracy and uniformity.

Use of a more controlled surface treatment for protecting resistors initially formed by ion implantation in a silicon layer is required to obtain satisfactory piezoresistors for the stress sensors to be used in these applications. That treatment can be achieved by use of a second ion implantation step involving the implanting of a region of an opposite conductivity type from that of the doped piezoresistor region. The semiconductor junction isolated resistors formed in silicon as the result of a second ion implantation step have been found to be very uniform and very stable and so are excellent piezoresistors. These resistors are relatively voltage independent also.

Again, ion implantation allows for very close control of the location of the dopant atoms below the silicon layer surface. This results in the protective region formed just below the surface being confined very closely in extent so as to not approach any portion of the doped piezoresistor region which has a substantial dopant concentration, i.e. to particularly not approach that region of the piezoresistor where the maximum dopant concentration is located.

Further, the greater separation between the region of maximum dopant concentration in the piezoresistor and the regions of substantial dopant concentration in the protective region results in very good semiconductor junction breakdown values for the pn junction, or semiconductor junction, separating the second implanted region from the remaining doped piezoresistor regions. Also, the relatively low temperature cycle required for annealing the silicon layer to repair the silicon lattice damage in the implanted regions therein due to the implantation steps causes a relatively small redistribution of the dopant atoms in both the doped piezoresistive region and the protective region. Where the silicon layer is provided as an epitaxial layer on a semiconductor substrate, there will also be a relatively small redistribution of dopant atoms between the silicon layer and the substrate because of this low temperature.

Figure 2A:
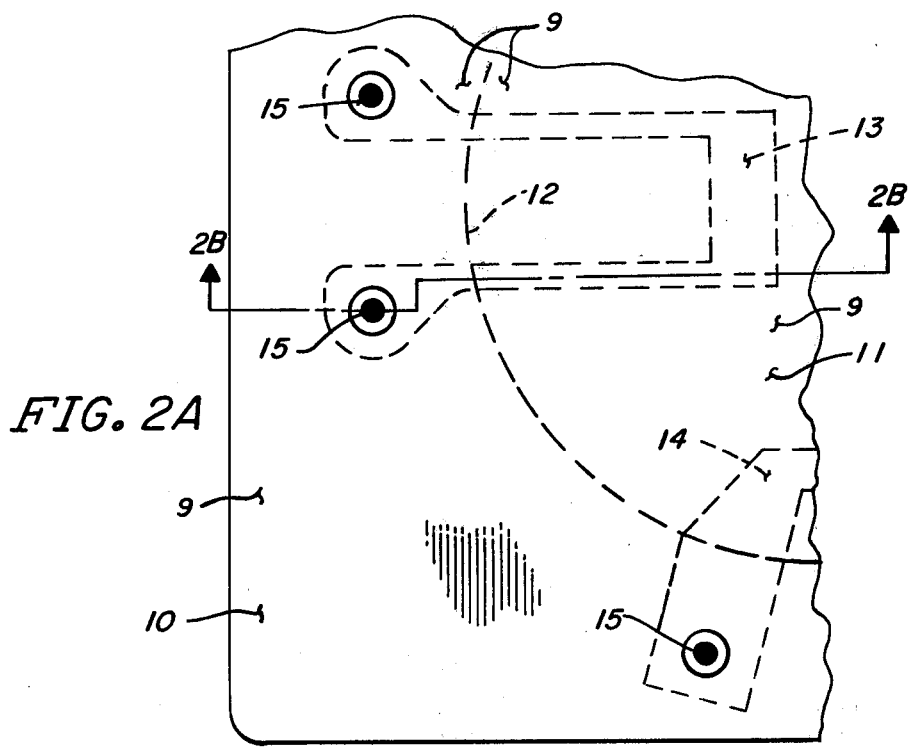
FIGS. 2a and 2b show two partial views of a semiconductor material stress sensor.

A semiconductor material stress sensor having ion implanted piezoresistors is shown in FIG. 2. FIG. 2A shows a top view of the stress sensor which, in the sensor construction shown in FIG. 2, is the top of a silicon layer, 9, in which the piezoresistors are formed. One portion of this silicon layer, 10, is over and part of that portion of the stress sensor serving as a constraint to support the sensor diaphragm portion. Another silicon layer portion, 11, which is over and part of the sensor diaphragm portion, the dashed line, 12, indicating approximately the boundary between these two portions of the stress sensor, the constraint and the diaphragm.

Two piezoresistors, 13 and 14, are provided in the silicon layer such that each has a portion in both diaphragm layer portion 11 and constraint layer portion 10. Neither intersects the silicon layer surface except near the contacts, 15, so both are shown by a dashed line outline. The silicon layer is of n-type conductivity silicon where shown except where the piezoresistors 13 and 14 are formed. These piezoresistors are of p-type conductivity silicon material. Typically, two piezoresistors are used together at one stress sensing location on the diaphragm to subsequent signal processing circuitry having a double signal strength and usual resistance value temperature coefficient compensation. Piezoresistor 13 senses radial stress in the diaphragm layer portion 11 as can be seen by noting that most of the resistance will occur in a thin arms along radii drawn from the center of the diaphragm. Piezoresistor 14, on the other hand, will sense tangential stress in the diaphragm layer portion.

Figure 2B:
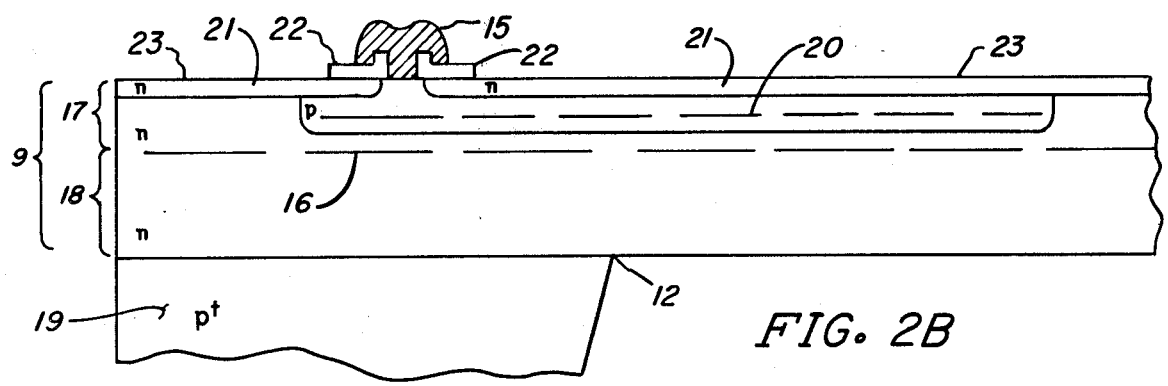

FIG. 2B is a cross-sectional view of FIG. 2A. The cross section is taken along section line 2B—2B.

The silicon layer 9 can be better understood from the view in FIG. 2B where the total or complete silicon layer is shown designated thereby by a bracket and the numeral 9. That portion of silicon layer 9 to the left of the constraint-diaphragm juncture, or boundary 12, is the constraint layer portion 10 of FIG. 2A. That layer portion to the right of boundary 12 in FIG. 2B is the diaphragm layer portion 11 of FIG. 2A.

Silicon layer 9 is shown with a dashed line, 16, which is used to mark approximately a boundary between a strata, 17, of layer 9 having a higher conductivity and another strate, 18, of layer 9 having a lower conductivity. The higher conductivity strata 17 of layer 9 is provided to improve results of the electrolytic etching process used in providing a recess in the substrate, 19, upon which layer 9 is formed. The recess occurs to the right of boundary 12 in FIG. 2B to provide the diaphragm portion of the stress sensor.

Piezoresistor 13 is shown with dashed line, 20, drawn therein to indicate approximately the region of maximum dopant concentration for the dopant implanted to form the piezoresistor. A surface protection region, 21, is shown over piezoresistor 13 in the diaphragm layer portion 11 but not over all of piezoresistor 13 where it extends into the constraint layer portion 10. Protective region 21 could be formed by diffusion, epitaxial growth or ion implantation methods as indicated above. Again, the most repeatable and accurate stress sensor unit results when region 21 is provided by ion implantation.

Electrical contact 15 is shown making ohmic contact to piezoresistor 13 through electrically insulating silicon dioxide ring, 22. As mentioned, the silicon dioxide 22 could be extended over silicon layer surface 23, to some thickness to protect piezoresistor 13 from elements that would otherwise come into contact with surface 23. Of course, mechanical performance of the diaphragm is constrained by such a covering of silicon dioxide, thinner layers of oxide providing less constraint. The constraint may have a negligible effect where the oxide is quite thin and where other errors such as due to mechanical stress in the mounting of the substrate are relatively large.

Turning now to FIG. 3, there is depicted the results of process steps performed to provide the structure shown in FIG. 2. The initial process steps are shown wherein piezoresistor region 13 of FIG. 2 is provided by ion implantation followed by showing the further process steps to provide region 21 of FIG. 2 as an implanted region, although other methods of providing region 21, such as diffusion or epitaxial growth, could be used as discussed above. Also, clearly after the implantation of piezoresistors, a silicon oxide layer could be provided on the silicon layer surface 23 over region 21 or over the piezoresistor region 13 without region 21 being present.

FIG. 3A shows the result of an epitaxial growth of an n-type conductivity layer 30 upon a p+ substrate, 31. Substrate 31 has a resistivity of 0.01 $\Omega$-cm approximately. Layer 30 is grown such that the first strata of the layer, 32, has a resistivity of around 10 to 20 $\Omega$-cm while the final strata of a layer, 33, has a resistivity of 0.50 $\Omega$-cm, the two strata being approximately separated by a line designated 34. The final strata 33 is grown just as the initial strata, that is, both by conventional epitaxial growth techniques, the concentration of the dopant during growth being increased during the final portion of the epitaxial layer growth. Layer 30 has an approximate total thickness of 30 $\mu$m with layer 32 being approximately 20 $\mu$m.

As indicated in the preceding, strata 33 aids in the etching step performed later in the process for the formation of the diaphragm portion of the semiconductor material stress sensor. Strata 33 will approximate to some degree an equipotential layer to aid in the electrolytic etching occurring in this later step. Also, strata 33 provides a poor semiconductor junction injection efficiency for the semiconductor junctions resulting from the provision of piezoresistors while the strata has a high recombination rate to thereby prevent holes from being etched in the epitaxial layer during the etching process near the piezoresistors.

Thereafter, thermal oxide is grown in a manner well known in the art on the exposed surface, 35, of the epitaxial layer. The result is shown in FIG. 3B where silicon dioxide has been grown thermally to approximately 12,000Å to form a masking layer, 36.

Conventional photoresist techniques are used to cut a pattern in silicon dioxide layer 36 for forming the piezoresistor regions in the diaphragm layer portion and the piezoresistor resistive lead-outs to the constraint layer portion. Following this, thermal oxide of approximately 600 Å is regrown on surface 35, the layer designated by numeral 37, to serve as a scattering oxide. This scattering oxide serves as an amorphous coating over the areas selected for ion implantation, that is the piezoresistor and resistive lead-out regions, to cause some scattering of the impinging ions so they do not happen to line up with the silicon lattice in layer 30 and go much deeper than expected for a given average ion energy. Results of these steps are shown in FIG. 3C.

At this point in the process, a deep boron implant is made using boron ions having an average energy of approximately 300 kev. The ion beam is adjusted such that the dose is $5.7 \cdot 10^{14}$ ions/cm$^2$. The result is a maximum boron concentration of approximately $10^{19}$ atoms/cm$^3$ and a sheet resistivity of approximately 130 $\Omega/\square$.

The result of these steps is shown in FIG. 3D where a p-type region, 38, has been formed below surface 35 of the silicon layer 30 and within strata 33 of that layer. A second dashed line, 39, is shown within p-type conductivity region 38 to indicate that an approximate location of the region of maximum boron concentration. This location is typically 0.7 to 0.9 μm below surface 35 while the pn junction, i.e. the semiconductor junction, defining the deepest portions of p-type conductivity region 38 below surface 35 will be located approximately 1.3 μm below surface 35.

Using these values, the final piezoresistors which will result from p-type conductivity region 38 will have dimensions so as to have about a 5,000 Ω resistance value. This resistance value provides a reasonable compromise between (i) having a sufficient output signal when a given amount of stress is exerted on the diaphragm portion of the sensor in face of both the amount of noise unavoidably present and the errors introduced by the signal processing circuit while keeping the required signal processing circuit gain reasonably small, and (ii) having the current necessary to energize the stress sensor piezoresistors kept sufficiently low so differential heating due to current flow in the stress sensor will not cause erroneous sensor output signals. Piezoresistors having this resistance value can be of convenient dimensions in surface 35 given the resistivity values for p-type conductivity region 38 set out above. The resulting piezoresistor will be neither too long and so difficult to locate at optimum stress sensing positions in the diaphragm nor too narrow so as to create problems involving excessive resistance value tolerances due to variations in providing cuts in the mask in layer 36.

After the boron implantation, the silicon dioxide mask 36 is stripped away from the silicon layer surface 35 by the use of conventional photoresist techniques except where electrical contacts for the piezoresistors are desired. Thus, in FIG. 3E, a small portion of the oxide scattering layer 37 remains on surface 35 where protected by a photoresist layer portion, 40. The remaining oxide will serve as a marker for locating electrical contacts later while photoresist layer portion 40 will serve as an implantation mask for the remaining ion implantation step. Of course, if less precise and stable stress sensors are satisfactory, the following step might be a diffusion or epitaxial growth step rather than a second ion implantation step.

The second ion implantation step involves impinging phosphorous ions upon the structure shown in FIG. 3E to provide a shallow phosphorous implanted region over the boron implanted region at locations where electrical contacts are desired. The phosphorous ion implantation step takes place using phosphorous ions having an average energy of approximately 50 kev while impinging in an ion beam providing a dose of $10^{13}$ ion/cm$^2$. The maximum phosphorous atom concentration reached is approximately $6.0 \cdot 10^{17}$ atoms/cm$^3$. The region of maximum phosphorous concentration is located at approximately 0.1 μm or less below surface 35. The result is shown in FIG. 3F where the photoresist mask has been removed after the second ion implantation step. However, the scattering oxide 37 is still retained to aid in finding the locations for electrical contacts provided in later steps.

The result of this ion implantation step is the formation of an n-type conductivity region, 41, which forms or will form a portion of the pn junction or semiconductor junction which separates the remainder of the p-type conductivity region 38, region 38', from the other portions of silicon layer 30. Prior to annealing, the implanted region may not be deep enough to establish the junction defining the upper boundary of region 38' but rather the dopant in strata 33 determines this boundary. This portion of the semiconductor junction is located between region 38' and surface 35 at approximately just greater than 0.1 μm below surface 35. Thus, the semiconductor junction due, or which will be due after annealing, to the formation of region 41 is a substantial distance from the maximum boron concentration location 39 in p-type conductivity region 38' so that small differences in the depth of this added pn junction have little effect on the electrical and temperature characteristics of p-type conductivity region 38'. And, of course, the variations in depth of the added pn junction will be relatively quite small because of the excellent control available in ion implantation process steps.

Also, the maximum dopant concentrations in each of the regions 41 and 38' are widely separated so that the pn junction therebetween has a satisfactory breakdown voltage. In aid of this goal, the phosphorous concentration in region 41 is kept as small as possible, i.e. substantially less than the maximum boron concentration, being just enough to reconvert the silicon layer at the surface of silicon layer 30 to n-type conductivity material and to assure that the depletion region in operation in region 41 does not reach surface 35.

Upon removing the photoresist implantation mask, the structure must go through an annealing cycle to repair silicon lattice damage due to the ion implantation steps. This annealing cycle performed at 950° C for approximately 10 minutes in dry nitrogen followed by substituting wet oxygen for the dry nitrogen for approximately 20 minutes, the use of wet oxygen resulting in the thermal growth of a silicon dioxide layer. This oxide layer is not allowed to form on the surface 35 immediately in the annealing cycle because healing of the lattice defects might be impeded thereby. Introducing the wet oxygen leads to growing approximately 2,000 Å thick silicon dioxide layer, 42, on surface 35 and over scattering oxide portion 37.

The annealing-oxidation cycle is done at the relatively low temperature of 950° C to minimize redistribution of the dopants in the implanted regions, region 41 and region 38', which alters the structure of these regions and so the structure of the stress sensor. This also prevents any substantial redistribution of the dopants between the n-type conductivity epitaxial layer 30 and the p-type conductivity substrate 31 which is desirable for achieving a sharp etching cutoff in the diaphragm etching step yet to come. The result of these steps is shown in FIG. 3G. The region of maximum boron concentration remains at about 0.7 to 0.9 μm while the region of maximum phosphorous concentration occurs near or at surface 35. The semiconductor junction between regions 38' and 41 is now located at approximately 0.2 μm below surface 35.

A greater thickness of silicon dioxide is required, hoqwever, beyond the 2,000 Å provided in the annealing-oxidation cycle. Continuing to thermally grow such oxide, even at the relatively low temperature of the annealing-oxidation cycle, risks redistributing the dopants in the manner described to be avoided in the foregoing paragraph. Therefore, the added silicon dioxide is provided by pyrolytic deposition of silicon dioxide at 300° C until the total silicon dioxide thickness reaches approximately 5,000 Å. For convenience, the entire resulting silicon dioxide layer from both steps is included in the silicon dioxide layer 42 shown in FIG. 3G.

Next, electrical contact cuts are provided in silicon dioxide layer 42 by the use of conventional photoresist techniques to thereby provide access to the piezoresistors. The result is shown in FIG. 3H. The cut or opening in silicon dioxide layer 42 is labeled 43 and provides access to p-type conductivity region 38'.

Ohmic electrical contacts are now provided for contacting the piezoresistors, that is in FIG. 3H for contacting p-type conductivity region 38'. If a corrosive atmosphere is to be in contact with the stress sensor unit, a special metallization structure may be required to resist deterioration in such atmospheres, possibly using a combination of metals. Unless such extreme circumstances are to be encountered, a typical metallization process such as that conventionally used in providing the usual kinds of monolithic integrated circuits is satisfactory. In typical monolithic integrated circuits, aluminum is deposited to form the interconnection metallization network and satisfactory electrical contacts can be formed in the stress sensor by aluminum using well-known aluminum metallization steps. The result of such steps is shown in FIG. 3I where an electrical contact, 44, is shown.

After the metal contacts are formed, the portion of silicon dioxide layer 42 not in the immediate area of the contacts can be removed by conventional photoresist techniques. Once this is done, the silicon dioxide layer has no material over the surface where applied stress is intended to be measured and so the silicon layer can respond without hindrance from such a silicon dioxide covering to provide a proper mechanical response to the applied stress. However, if the mounting arrangement for the semiconductor material has substantial amount of hysteresis or other errors are predominant in the stress sensor structure, the relatively thin layer of silicon dioxide comprising layer 42 can be left in place since the errors and stress sensor response caused by this layer will be relatively unimportant. The structure with the unnecessary portions of layer 42 removed is shown in FIG. 3J.

If a semiconductor material stress sensor is desired in the form of a wafer with the outer regions of the wafer mounted directly on a support, the thickness of substrate 31 is chosen accordingly. The portions of the semiconductor wafer which are fastened to the support become part of the constraint while the remaining portions of the semiconductor wafer serve as a diaphragm.

Quite often, however, to minimize the effect of hysteresis in the bonding means mechanically connecting the semiconductor material stress sensor and its support together, a part of the constraint is provided in a semiconductor material. Substrate 31 is made sufficiently thick so that a portion of it may be etched or machined away thereby leaving the epitaxial layer or the epitaxial layer and some portion of the substrate as the diaphragm and leaving the remaining portions of the substrate and the epitaxial layer adhering thereto as the constraint portions of the semiconductor material stress sensor.

In typically providing this latter structure by etching, the bottom of the substrate 31 is coated with a metal such as platinum, the resulting platinum layer having openings provided therein where etching of the substrate is to occur. Electrical contact is made to the platinum metal and the entire structure is then immersed in an electrolyte where a more or less conventional electrolytic etch is made. The resulting structure is shown in part in FIG. 3K which matches FIG. 3J except for the recess shown in substrate 31. This recess is labeled 45. The support then for the entire semiconductor stress sensor is mechanically bonded to the remaining portions of substrate 31. The support should have a coefficient of thermal expansion closely matched to the expansion coefficient of substrate 31 and the bond should be as hysteresis free as possible. A silicon support and a gold eutectic bond might be used, for instance.

Another typical structure which is bonded to substrate 31 is a low thermal expansion glass tube which allows the tube to transmit a gas from some other point to the diaphragm portion of the semiconductor stress sensor to measure the pressure of the gas by measuring the stress that the gas exerts on the diaphragm. Another possibility for such a glass tube bonded to the stress sensor is to the end of the glass tube opposite from the end bonded to the semiconductor stress sensor with the tube either being evacuated or containing a gas of a selected pressure therein. The semiconductor material stress sensor thus becomes a differential pressure sensor with respect to a reference pressure of zero psi (absolute pressure) or some other pressure. Electrostatic bonding is one known method for effecting a bond between the substrate 31 and a low thermal expansion glass.

The structure shown in FIGS. 2 and 3 indicates that an n-type conductivity epitaxial layer is to be provided on a $p^+$-type substrate with the piezoresistors formed also being of p-type conductivity material. However, the structural portions may have different conductivity types so long as the piezoresistors and the surrounding semiconductor material have opposite conductivity types.

FIG. 4 shows a plot of dopant concentration C, versus depth below the silicon layer surface, X, for a sensor unit constructed in the manner described in connection with FIG. 3. Depth below surface 35 of FIG. 3 is plotted on the horizontal axis in microns while the dopant concentration in atom/cm$^3$ is plotted on the vertical axis. Curves for the concentration of the implanted p-type conductivity dopant are labeled Cp, the concentration of boron atoms. The remaining curves labeled Cn, are plotted for the implanted n-type conductivity dopant in FIG. 3 which is phosphorous. The concentrations after implanting are shown in dashed lines while the curves of the final structures in FIG. 3, after the annealing step, are drawn in solid lines.

The substantial separation between the maximum dopant concentrations for both the n-type dopant and the p-type dopant in the final structure is evident from the peaks of the two curves. The intersection of the two solid line curves with one another approximately defines the final location of the pn junction and shows that the junction occurs where there is a relatively low concentration of p-type conductivity dopant. Thus, a small shift in that intersection either inward or outward from where it is shown in the plot of FIG. 4 will have relatively little effect on the total number of dopant atoms in the p-type conductivity region and essentially no effect upon the maximum concentration value of the p-type dopant in the p-type conductivity region. Thus, total resistance value and piezoresistor temperature coefficient will not be much affected either by a small shift in this intersection.

This substantial separation between maximum dopane concentrations for both types of dopants also yields a good junction breakdown voltage characteristic. The value achieved exceeds 10 volts.

Returning now to the mounting of the substrate 31 on a low thermal expansion glass tube as mentioned above, there is a substantial connection between the manner of such mounting and the resulting offset shift with temperature occurring in completed sensor units. FIGS. 5 show, again, plots of resistance change, $\Delta R$, versus stress, S, for four different sensing units, A, B, C and D, the plots being magnified around the origin. The offset value for each sensor is that value occurring in each sensing unit performance curve at the intercept thereof along the $\Delta R$ axis at some standard temperature, $T_0$. Such offset values result from mismatches occurring between piezoresistors in the fabrication thereof, sensor mounting differences, and the like. Though unavoidable to a certain extent, such offset values of any one temperature are easily compensated by sensor signal conditioning circuits.

However, the offset values for sensor units shift with temperature because of mismatches between piezoresistor temperature coefficients, because of mismatches of thermal expansion coefficients between the sensor material and the mounting structure material, etc. This can be seen by noting the performance curves in FIGS. 5 for each unit as provided for the different temperatures $T_1$ and $T_2$, which also differ from $T_0$. The mounting arrangement has been found to affect in particular this last listed mismatch problem, offset shift with temperature due to the thermal expansion coefficient mismatch.

Figure 5A:
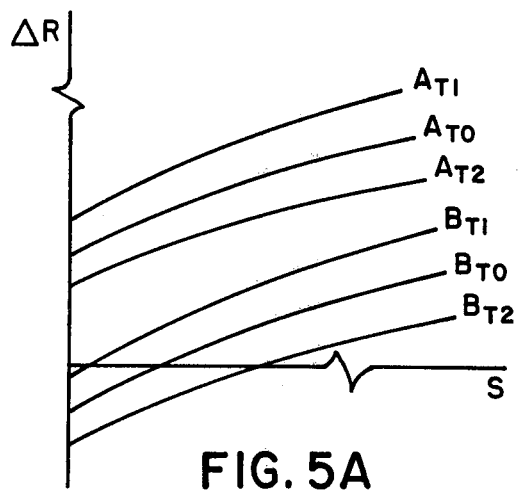
FIG. 5 shows plots of resistance changes versus stress for different sensing units in different mounting arrangements.
Figure 5B:
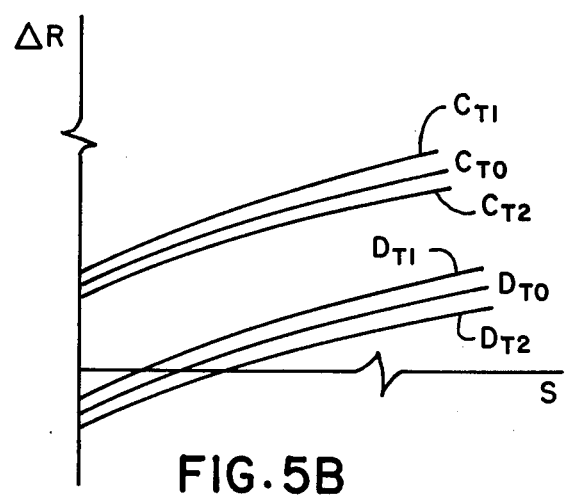

Sensor performance curves shown in the plots of FIGS. 5A and B result from sensors mounted in two different arrangements, FIG. 5A representing two sensor units, A and B, using a first mounting arrangement and FIG. 5B representing two sensor units, C and D, using a second mounting arrangement. Stress sensor units A and B have used mounting arrangement 1 which is the mounting arrangement shown in FIG. 6, while units C and D have used mounting arrangement 2 which is shown in FIG. 7. Clearly from FIGS. 5, mounting arrangement 1 yields a distribution of absolute values of offset shifts with temperature having a mean which is considerably greater than the mean of a similar distribution for mounting arrangement 2. This can be seen by comparing the shift of the $\Delta R$ axis intercepts with temperature for the sensor units in FIG. 5A with those in FIG. 5B. Thus, offset shift with temperature is a function of the mounting arrangement.

Because significant offset shifts with temperature must be compensated in the sensor signal processing circuitry to obtain a precise stress sensing unit, the distribution for mounting arrangement 2 shown in FIG. 5 is considerably more desirable than that for mounting arrangement 1 as the amount of offset shift is considerably less. This may lead to requiring little or even no compensation as a function of temperature (although the nominal offset value still must be compensated). An optimum mounting arrangement can yield a mean for the offset temperature shift distribution of units made by this method sufficiently near zero, repeatedly, as to result in not needing any compensation in the signal processing circuitry for such shifts. Such a mounting arrangement optimum is described below.

Figure 6:
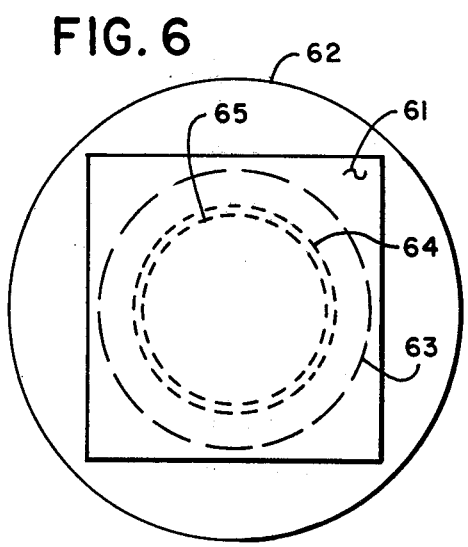
FIGS. 6 through 15 show various mounting arrangements for sensing units.
Figure 7:
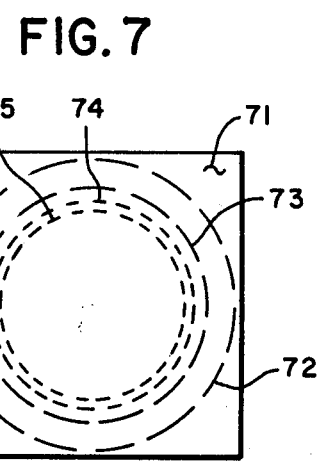

FIG. 6 shows a top view of a semiconductor material stress sensor chip, 61, mounted on the end of a hollow, low thermal expansion glass tube, 62, having its inner radius, 63, depicted by a long dashed line. The short dashed lines represent definition of the recess forming the diaphragm in the semiconductor material of stress sensor 61. The outer short dashed line, 64, represents the recess outline in that surface of stress sensor 61 in which bonding occurs to glass tube 62. The inner short dashed line, 65, represents the intersection of the recess wall and the diaphragm in stress sensor 61 indicating the recess wall is not vertical.

In FIG. 6, a well known electrostatic bonding method has been used to effect a bond between glass tube 62 and stress sensor 61. The common result of this method is that bonding has occurred along the edge of the semiconductor material stress sensor 61, i.e. along the outer periphery of the square chip. Thus, the bonding surfaces are not symetrical with respect to the outline defining the diaphragm recess, for instance dashed line 64, and this is found to result in the substantial offset shifts shown for units A and B of FIG. 5A.

In FIG. 7, on the other hand, there is again shown a semiconductor material stress sensor chip, 71, of just the kind that is shown in FIG. 6. However, stress sensor 71 is bonded, by the same electrostatic bonding method, to the end of a substantially different hollow, low thermal expansion glass tube, 72, represented by two long dashed lines with the long dashed line marked 73 again being the inner diameter of the glass tube. The recess in stress sensor chip 71 are again defined by short dashed lines, here 74 and 75. The electrostatic bonding method here has resulted in the bond following the circular outer edge of the tube 72 so that the bonding surfaces are symetrical with respect to the recess in chip 71. This mounting arrangement, used for stress sensor units C and D of FIG. 5B, results in a symetrical mounting constraint leading to an offset shift distribution mean much closer to zero.

Achieving a minimal offset shift by choice of mounting arrangement, where the mounting structure has a different material and so a different temperature coefficient of expansion from that of the stress sensor, has been found to require that the bonded surfaces on the two sides of the bond be symetrical with respect to the outline of the recess in the bonding surface of the stress sensor, and further, that a particular distance be maintained between these bonded surfaces and this recess outline. That is to say, for instance, for the semiconductor material stress chip, 81, shown in FIG. 8 with its mounting surface, 82, facing the viewer to expose its recess, 83, there is an optimum portion of mounting surface 82 which is to be bonded to the mounting structure. That optimum surface portion is a closed surface band, 84, contained in mounting surface 82 having an inner outline, 85, and an outer outline, 86, which are positioned equidistant from the recess outline, 87, occurring in mounting surface 82. The width of surface band 84 is to be determined by the desired or minimum practical width of the bonding surfaces occurring in mounting surface 82 as a result of the particular bonding method used to effect a bond between stress sensor 81 and a mounting structure, for instance, electrostatic bonding.

The location of surface band 84 must be found for each stress sensor design to find the minimum offset shift, in either direction from zero, for that stress sensor design. Once found, either through experiment or by analysis, confining the bonding surfaces within surface band 84 will result in such a minimum or near minimum offset shift.

Figure 8:
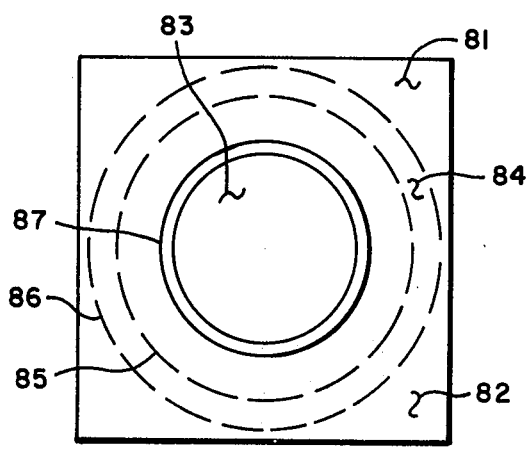
Figure 9:
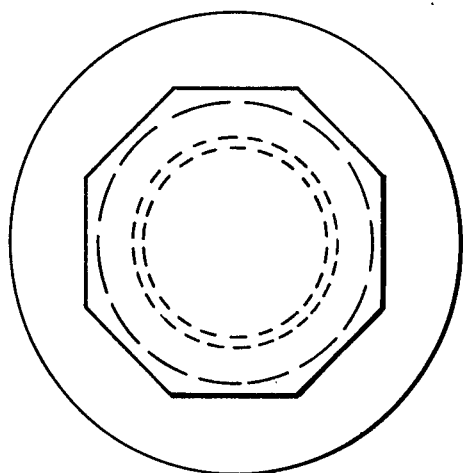
Figure 10:
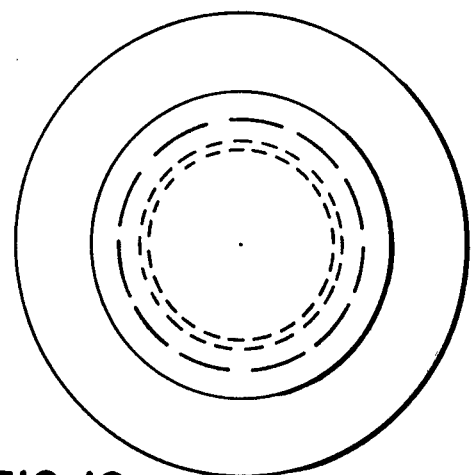

There are a number of ways in which the bonding surfaces involved in a bond of the mounting structure to surface band (whether by electrostatic bonding or otherwise) 84 can be so confined and properly located. When bonding occurs at the edge of stress sensor as described in connection with FIG. 6, the bonding can be forced to occur substantially in the surface band of a stress sensor, such as shown in FIG. 8, by more or less eliminating the material outside of that band in the stress sensor chip. Thus, as shown in FIG. 9, in situations where only straight cuts are to be made in the stress sensor, because of economic constraints or lack of specialized equipment, the corners of the stress sensor of FIG. 6 can be cut off before bonding to approximate eliminating the material outside the surface band. Of course, where it is feasible to provide a circular constraint portion or outer edge for the sensor chip as well as a circular recess therein, the outer outline of the surface band, i.e. outline 86 of FIG. 8, can be used as the boundary or edge of the stress sensor so that bonding at the outer edges of the stress sensor will result in the bonding surfaces occurring in the surface band at the edge of the stress sensor chip as shown in FIG. 10.

Figure 11:
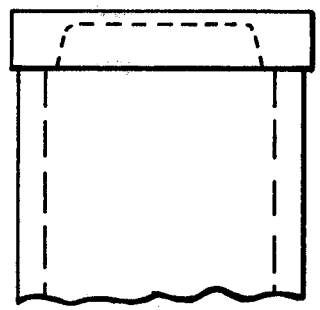
Figure 12:
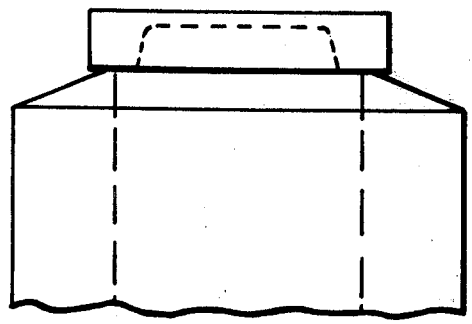
Figure 13:
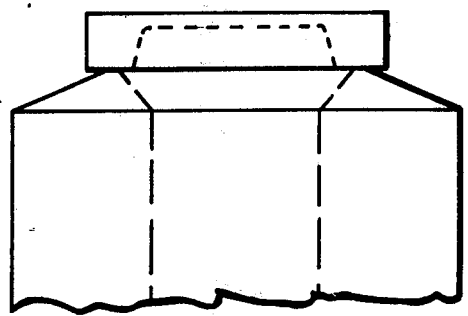
Figure 14:
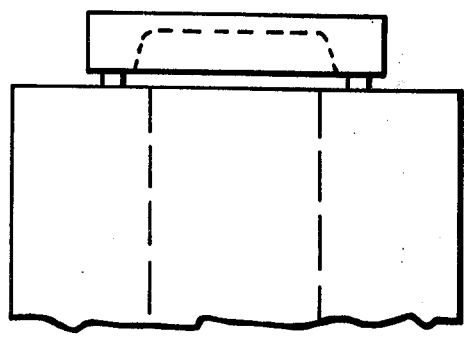

Alternatively, the low thermal expansion glass tube being used as a mounting structure can be shaped such that the bond made occurs in the surface band of the stress sensor chip, i.e. in surface band 84 of surface 82 in FIG. 8. As is indicated in FIG. 7, a low thermal expansion glass tube having an inner and outer diameter approximately equal to the diameters of the inner and outer outlines of the surface band, outlines 85 and 86 in FIG. 8, can be bonded to the mounting surface 82 to result in the structure shown in FIG. 7. A side view of this structure is shown in FIG. 11. The wall thickness of such a low thermal expansion glass tube in the structure of FIG. 11 might be found too thin for some purposes at some points along the wall or at its opposite end. In these circumstances, a beveled tube structure may be a possible arrangement such as shown in FIGS. 12 and 13 or a tube with a raised boss on its end such as shown in FIG. 14 may be satisfactory. Of course, the boss might also be on the semiconductor stress sensor chip at the location of the surface band. Rather than a rectangular cross-section boss, of course, any raised ridge in the mating surface peaking at the surface band location could be used.

Figure 15:
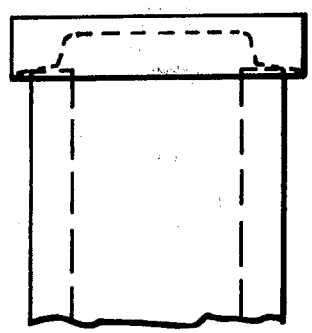

Another technique is to some degree or another slope the mounting surface 82 from the or near the edge of the chip inwardly along paths directed toward the recess 83 so that a mounting structure glass tube, having an outer diameter approximately that of the diameter of the surface band 84, would just touch at its outer edge to the surface band portion of mounting surface 82. FIG. 15 shows such an arrangement. The slope is somewhat exaggerated in FIG. 15 for clarity. The slope can be produced easily such as by chemical polishing of the mounting surface of the semiconductor stress sensors while they are still joined together in a wafer before being sawed into rectangular shapes to form individual stress sensors. Chemical polishing will eliminate the most chip material around the recesses and progressively less towards the centers of the portions in the wafers which are to serve as constraints in individual sensors.

All of these methods allow forming a bond between a low thermal expansion glass mounting structure and a semiconductor material stress sensor at a selected set of bonding surfaces in that stress sensor. For minimum or near minimum offset shift, the set of bonding surfaces should be in that surface band of the stress sensor which will permit such a minimum as found by experiment or analysis for the particular stress sensor design. Further arrangements for a selective bond at the mounting surface of the semiconductor stress sensor can no doubt be devised without departing from the scope of the present invention as can other sensor edge shapes, recess outline and mounting structures.

The embodiments of the invention in which an exclusive property or right is claimed are defined as follows:

1. A stress sensing unit comprising:
    a semiconductor material stress sensor having a first surface, said stress sensor having structural portions including substantially in a crystalline relationship a diaphragm and a constraint for constraining said diaphragm at peripheral portions thereof with said diaphragm portion being formed by a recess in said semiconductor material stress sensor which opens onto said first surface resulting in an outline of said recess in said first surface where said first surface is formed by said constraint portions; and
    a mounting structure of a material of another kind from that in said semiconductor material stress sensor, said mounting structure being bonded to said semiconductor material stress sensor at bonded surfaces in said first surface contained within a closed surface band in turn contained within said first surface to thereby form a bond, said surface band having an inner outline everywhere substantially equidistant from said recess outline and having an outer outline also everywhere substantially equidistant from said recess outline with said inner and outer outlines being separated just enough to include that bonded surface portion having maximum extent perpendicular to said inner and outer outlines.

2. The apparatus of claim 1 wherein said material of said mounting structure, just beyond any deformation at said bond due to said bonding, extends beyond said surface band, to an extent in a direction parallel to said first surface, on both sides of said surface band.

3. The apparatus of claim 1 wherein said material of said mounting structure, except for any deformation of said bond due to bonding, extends beyond said surface band, to an extent in a direction parallel to said first surface, on only one side of said surface band.

4. The apparatus of claim 1 wherein said material of said mounting structure, except for any deformation of said bond due to bonding, extends, in a direction parallel to said first surface, only within said surface band.

5. The apparatus of claim 1 wherein said surface band is in a location in said first surface such that said sensor unit has a smaller offset shift than it would have were said surface band to be located in said first surface immediately adjacent on either side of said location insofar as construction of said stress sensor would permit.

6. The apparatus of claim 1 wherein said surface band is in a location in said first surface such that said stress sensor unit has approximately its smallest offset shift.

7. The apparatus of claim 1 wherein said first surface is non-planar.

8. The apparatus of claim 2 wherein said first surface is non-planar.

9. The apparatus of claim 2 wherein said mounting structure has a boss on a surface thereof, where said boss is shaped to match said surface band, with said boss bonded to said surface band.

10. The apparatus of claim 2 wherein said semiconductor material stress sensor is confined to at least being approximately within said outer outline.

11. The apparatus of claim 3 wherein said first surface is non-planar.

12. The apparatus of claim 3 wherein said mounting structure has a boss on a surface thereof, where said boss is shaped to match said surface band, with said boss bonded to said surface band.

13. The apparatus of claim 3 wherein said semiconductor material stress sensor is confined to at least being approximately within said outer outline.

14. The apparatus of claim 3 wherein said mounting structure is beveled at some locations just beyond any deformation occurring at said bond due to bonding.

15. The apparatus of claim 4 wherein said first surface is non-planar.

16. The apparatus of claim 2 wherein said mounting structure is beveled at some locations just beyond any deformation occurring at said bond due to bonding.

17. The apparatus of claim 7 wherein said first surface has a peak in said surface band.

18. The apparatus of claim 7 wherein said first surface slopes inwardly from its outer boundary to said recess outline.

19. The apparatus of claim 10 wherein said outer outline forms a boundary of said semiconductor material stress sensor.

20. The apparatus of claim 13 wherein said outer outline forms a boundary of said semiconductor material stress sensor.

21. The apparatus of claim 14 wherein said mounting structure has a boss on a surface thereof, where said boss is shaped to match said surface band, with said boss bonded to said surface band.

22. The apparatus of claim 4 wherein said outer outline forms a boundary of said semiconductor material stress sensor.

23. The apparatus of claim 16 wherein said mounting structure has a boss on a surface thereof, where said boss is shaped to match said surface band, with said boss bonded to said surface band.

24. A stress sensing unit comprising:
A semiconductor material stress sensor having a first surface, said stress sensor having structural portions including substantially a diaphragm and a constraint for constraining said diaphragm at peripheral portions thereof with said diaphragm portion being formed by a recess in said semiconductor material stress sensor which opens onto said first surface resulting in an outline of said recess in said first surface where said first surface is formed by said constraint portions; and
a mounting structure of a material of another kind from that in said semiconductor material stress sensor, said mounting structure being bonded to said semiconductor material stress sensor at bonded surfaces in said first surface contained within a closed surface band in turn contained within said first surface to thereby form a bond, said surface band having an inner outline everywhere substantially equidistant from said recess outline and having an outer outline also everywhere substantially equidistant from said recess outline with said inner and outer outlines being separated just enough to include that bonded surface portion having maximum extent perpendicular to said inner and outer outlines and said surface band being in a location in said first surface such that said stress sensing unit has approximately its smallest offset shift with temperature.

25. The apparatus of claim 24 wherein said material of said mounting structure, just beyond any deformation at said bond due to said bonding, extends beyond said surface band, to an extent in a direction parallel to said first surface, on both sides of said surface band.

26. The apparatus of claim 24 wherein said material of said mounting structure, except for any deformation of said bond due to bonding, extends beyond said surface band, to an extent in a direction parallel to said first surface, on only one side of said surface band.

27. The apparatus of claim 24 wherein said material of said mounting structure, except for any deformation of said bond due to bonding, extends, in a direction parallel to said first surface, only within said surface band.

28. The apparatus of claim 24 wherein said first surface is non-planar.

29. The apparatus of claim 25 wherein said first surface is non-planar.

30. The apparatus of claim 25 wherein said mounting structure has a boss on a surface thereof, where said boss is shaped to match said surface band, with said boss bonded to said surface band.

31. The apparatus of claim 25 wherein said semiconductor material stress sensor is confined to at least being approximately within said outer outline.

32. The apparatus of claim 26 wherein said first surface is non-planar.

33. The apparatus of claim 26 wherein said mounting structure has a boss on a surface thereof, where said boss is shaped to match said surface band, with said boss bonded to said surface band.

34. The apparatus of claim 26 wherein said semiconductor material stress sensor is confined to at least being approximately within said outer outline.

35. The apparatus of claim 26 wherein said mounting structure is beveled at some locations just beyond any deformation occurring at said bond due to bonding.

36. The apparatus of claim 27 wherein said first surface is non-planar.

37. The apparatus of claim 25 wherein said mounting structure is beveled at some locations just beyond any deformation occurring at said bond due to bonding.

38. The apparatus of claim 8 wherein said first surface has a peak in said surface band.

39. The apparatus of claim 28 wherein said first surface slopes inwardly from its outer boundary to said recess outline.

40. The apparatus of claim 31 wherein said outer outline forms a boundary of said semiconductor material stress sensor.

41. The apparatus of claim 34 wherein said outer outline forms a boundary of said semiconductor material stress sensor.

42. The apparatus of claim 35 wherein said mounting structure has a boss on a surface thereof, where said boss is shaped to match said surface band, with said boss bonded to said surface band.

43. The apparatus of claim 27 wherein said outer outline forms a boundary of said semiconductor material stress sensor.

44. The apparatus of claim 37 wherein said mounting structure has a boss on a surface thereof, where said boss is shaped to match said surface band, with said boss bonded to said surface band.

* * * * *